United States Patent
Lee et al.

(10) Patent No.: US 9,299,919 B1
(45) Date of Patent: Mar. 29, 2016

(54) HALL SENSOR WITH IMPROVED DOPING PROFILE

(71) Applicant: Magnachip Semiconductor, Ltd., Cheongju-si (KR)

(72) Inventors: Seong Woo Lee, Cheongju-si (KR); Jae Hyung Jang, Daejeon-si (KR); Hee Baeg An, Cheongju-si (KR); Yu Shin Ryu, Daejeon-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/625,648

(22) Filed: Feb. 19, 2015

Related U.S. Application Data

(60) Provisional application No. 62/069,887, filed on Oct. 29, 2014.

(30) Foreign Application Priority Data

Oct. 27, 2014 (KR) .................. 10-2014-0146202

(51) Int. Cl.
*H01L 43/06* (2006.01)
*H01L 43/04* (2006.01)
*G01R 33/07* (2006.01)

(52) U.S. Cl.
CPC .............. *H01L 43/065* (2013.01); *G01R 33/07* (2013.01); *H01L 43/04* (2013.01)

(58) Field of Classification Search
None
See application file for complete search history.

(56) References Cited

U.S. PATENT DOCUMENTS

| | | | |
|---|---|---|---|
| 2006/0097715 A1* | 5/2006 | Oohira et al. | ............. 324/207.2 |
| 2010/0164483 A1 | 7/2010 | Namai et al. | |
| 2011/0127583 A1* | 6/2011 | Uhlig et al. | ................. 257/252 |
| 2014/0184211 A1 | 7/2014 | Fujita et al. | |

* cited by examiner

*Primary Examiner* — Scott B Geyer
(74) *Attorney, Agent, or Firm* — NSIP Law

(57) ABSTRACT

A Hall sensor with improved doping profile is disclosed. The Hall sensor includes a semiconductor substrate, a sensing region formed on the substrate, an isolation region formed on the sensing region, and a high concentration doping region formed on an upper portion of the sensing region.

15 Claims, 4 Drawing Sheets

HALL SENSOR WITH IMPROVED DOPING PROFILE

CROSS-REFERENCE TO RELATED APPLICATIONS

This application claims the benefit under 35 USC 119(a) of Korean Patent Application No. 10-2014-0146202 filed on Oct. 27, 2014, in the Korean Intellectual Property Office and under 35 USC 119(e) of U.S. Provisional Patent Application No. 62/069,887 filed on Oct. 29, 2014, the entire disclosure of these applications are incorporated herein by reference for all purposes.

BACKGROUND

1. Field

The following description relates to a Hall based on semiconductor device that is capable of improving doping profile of Well region (Deep N well) which is formed on a semiconductor substrate thereby providing identical sensing ability with conventional Hall sensor and reducing electricity consumption.

2. Description of Related Art

A Hall sensor or a Hall effect sensor is a device that detects a direction and size of a magnetic field by using the Hall effect. The Hall effect is the application of magnetic field to a conductor through which electrical current flows to generate voltage in a direction perpendicular to the electrical current and the magnetic field. The Hall sensor is used as an electronic compass, and particularly, a semiconductor-based Hall sensor, i.e., a Hall sensor implemented by a CMOS (complementary metal-oxide semiconductor) is widely used.

In a conventional Hall sensor or Hall element, a sensing region is formed on a semiconductor substrate. The sensing region is typically shaped in the form of a cross when viewed from the top, and electrodes are formed on the cross-shaped sensing region.

When a magnetic field is applied to the conventional Hall sensor, two facing electrodes among four electrodes are used to provide electric current flow, and the other two facing electrodes are used to provide Hall voltage generated in a direction perpendicular to the direction of flow of electrical current. In this way, the conventional Hall sensor senses the Hall voltage to detect the direction and size of the magnetic field.

The sensing region is an N-type doped well region (Deep N-well) on a P-type dopant doped semiconductor substrate. The well region (Deep N-well) is formed by ion injection process and a comparatively long enlargement process. The well region surface is formed to have highest doping concentration. Moreover, a semiconductor substrate can have various defects on the semiconductor surface and a relatively thin region with respect to the semiconductor surface. Additional process can be conducted to remove the various defects during manufacturing process. However, it is not easy to eliminate semiconductor substrate defects.

Accordingly, manufacturing a Hall sensor based on a semiconductor substrate with defects, leads to degradation in the Hall sensor's sensing ability. Electric current flows between the aforementioned two electrodes that face each other and are formed adjacent to the semiconductor substrate surface. Thus, electricity current flow can be disturbed due to various defects on a semiconductor substrate surface and the function of the Hall sensor can be degraded due to the occurrence of noise.

A Hall sensor detects direction and magnitude of a magnetic field by sensing Hall voltage and in order to do so Hall current should be provided. However, oversupply of Hall current to improve Hall sensor's sensing ability leads to a drain of the battery of the portable devices. A portable device with a Hall sensor should increase hours of battery use but oversupply of Hall current leads to more consumption of battery charge. Therefore, consumption current of Hall current should be minimized while providing identical sensing ability with conventional art.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The present disclosure solves the problem by providing a Hall sensor of a semiconductor substrate to form electricity current at a predetermined depth with respect to semiconductor substrate surface by applying doping profile of well region (Deep N well) formed on semiconductor substrate different from related art.

Another object of the present disclosure is to provide a Hall sensor of a semiconductor substrate that can process identical sensing ability while reducing Hall current amount supplied comparing to a Hall sensor of related art.

In one general aspect, there is provided a Hall sensor including a semiconductor substrate, a sensing region formed on the substrate, an isolation region formed on the sensing region, and a high concentration doping region formed on an upper portion of the sensing region, wherein a maximum doping concentration region is formed at a predetermined depth with respect to the substrate surface and the maximum doping concentration region is under the high concentration doping region.

The predetermined depth may be 0.7~2 μm from a surface of the substrate.

The maximum doping concentration region may be under the isolation region.

The maximum doping concentration region may be in the sensing region.

A doping profile of the sensing region may be parabolic in shape.

A maximum doping concentration of the sensing region may be from $1E15$ atom/cm$^3$ to $1E17$ atom/cm$^3$.

In another general aspect, there is provided a Hall sensor including a semiconductor substrate, a sensing region formed on the substrate, an isolation region formed on the sensing region, and a high concentration doping region formed on an upper portion of the sensing region.

A reference plane may be located at a region of maximum doping concentration in the sensing region, and a gradient of a first doping profile under the reference plane may be steeper than a gradient of a second doping profile above the reference plane.

A maximum doping concentration location in the sensing region may be a reference plane, a first doping concentration section with doping concentration of the sensing region under the reference plane, and a second doping concentration section with doping concentration of the sensing region above the reference plane, wherein the second doping concentration section may be larger than the first doping concentration section.

A sum of doping concentration of the first doping concentration section and a sum of doping concentration of the second doping concentration section may be different.

In another general aspect, there is provided a Hall sensor including a semiconductor substrate, a sensing region formed on the substrate, a first high concentration doping region formed on a portion of the sensing region, a second high concentration doping region formed on an upper portion of the sensing region an isolation region formed on the sensing region, the isolation region being in contact with the first high concentration doping region, and wherein a maximum doping concentration region is formed in the sensing region under the second high concentration doping region.

A depth of the sensing region may be 3~4 μm.

The maximum doping concentration region may be formed in the sensing region at a depth greater than a depth of the isolation region.

In a general aspect, there is provided a Hall sensor for well region wherein doping concentration has maximum value at predetermined depth with reference to the semiconductor substrate surface.

In a general aspect, there is provided a Hall sensor for improving noise feature since current flow route is formed at a separated area from the semiconductor substrate surface.

The Hall voltage sensitivity is also improved.

The Hall sensor disclosed herein provides an identical sensing ability in spite of reduced consumption in electricity current compared to a Hall sensor known in the art.

Other features and aspects may be apparent from the following detailed description, the drawings, and the claims.

Figure 1:
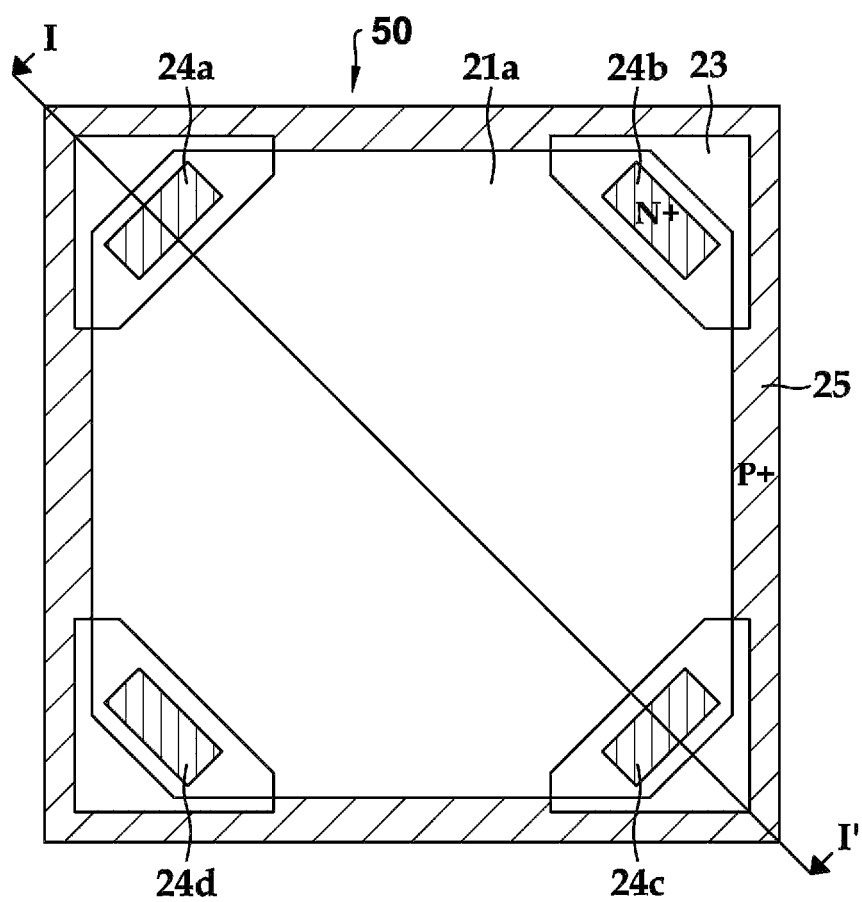
FIG. 1 is a diagram illustrating an example of a Hall sensor of a semiconductor substrate.

Throughout the drawings and the detailed description, unless otherwise described, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The present disclosure provides a Hall sensor where electric current consumed by a Hall sensor is reduced and Hall sensor current flow is improved by conducting doping for doping concentration value of predetermined depth of semiconductor substrate surface.

In the present example, a planar type Hall sensor is illustrated, and other types of Hall sensors are considered to be well within the scope of the present disclosure. For example, the present disclosure may also apply to a vertical type Hall sensor. Additionally, the present disclosure provides a doping profile with maximum value doping concentration in a sensing region placed at a 1~2 μm depth from a semiconductor substrate surface. Doping profile can be changed according to a size of semiconductor substrate and sensing region.

Figure 2:
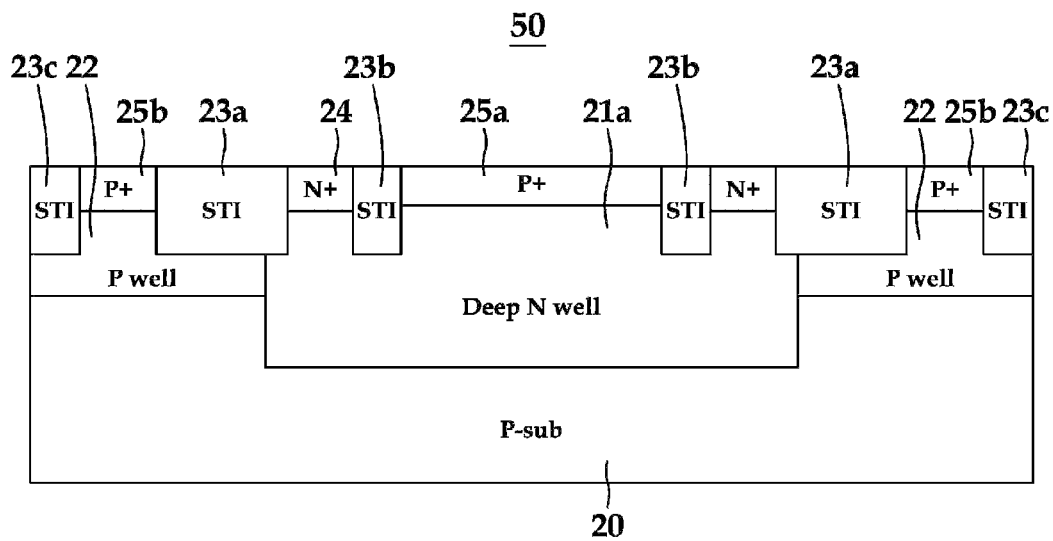
FIG. 2 is a diagram illustrating an example of a cross-section along line I-I' of FIG. 1

FIG. 1 is a diagram illustrating an example of a Hall sensor based on a semiconductor and FIG. 2 is a diagram illustrating an example of a cross-section along line I-I' FIG. 1.

As shown in FIGS. 1 and 2, a Hall sensor based on a semiconductor comprises P-type doped semiconductor substrate 20, and a Hall sensor 50 formed on semiconductor substrate 20. A Hall sensor 50 includes a sensing region 21a formed in the shape of an octagon and four N-type high concentration doping regions 24 formed on four corner surface of the sensing region 21a, i.e., 24a, 24b, 24c, and 24d. Sensing region 21a may be a magnetic sensing region that can sense earth's electric field.

The N-type high concentration doping region 24 comprises four electrodes from a first electrode to a fourth electrode 24: 24a, 24b, 24c, and 24d. A first electrode 24a and a third electrode 24c face each other and are placed vertically to measure Hall voltage. A first electrode to a fourth electrode 24a, 24b, 24c, and 24d, are rectangular in shape with a longer side of the electrodes formed in a 45° angle with the tangent line of an outer circumferential side (outline) of the sensing region 21a. A large quantity of electrical current flows in the sensing region 21a, so that even a small change in voltage can be easily detected. A first to fourth electrodes 24a, 24b, 24c, and 24d are doped with a higher N-type concentration than sensing region 21a so to lower resistance when they encounter a contact plug (not shown).

Sensing region 21a is an N-type doped Well region (N Well). P-type Well 22 is formed on an outer periphery of sensing region 21a. P-type high concentration doping regions 25a and 25b are formed on sensing region 21a and N Well 22, respectively. Therefore, P-type high concentration doping regions 25a and 25b are exposed on a top surface of semiconductor substrate 20. P+ Doping region 25b is arranged to connect with lower P-type Well 22 and applies ground voltage or negative voltage to P-type Well 22. Moreover, the doping concentration of P-type high concentration doping regions 25a and 25b may be relatively higher than doping concentration of the sensing region 21a to prevent expansion of depletion layer to substrate surface due to sensing region dose amount.

As shown in FIGS. 1 and 2, a first to fourth electrodes 24a, 24b, 24c, and 24d are formed on an insulator layer 23b, between P-type high concentration doping region 25a and 25b. Insulator layers 23a and 23b surround a first electrode to a fourth electrode 24a, 24b, 24c, and 24d. In the present examples, insulation layers 23a and 23b are formed, filled with thin trench isolation (STI), but other methods of element separation process such as, for example, Local Oxidation of Silicon (LOCOS) process and Deep Trench Isolation (DTI) and the like may be used without departing from the spirit and scope of the illustrative examples described.

Figure 3:
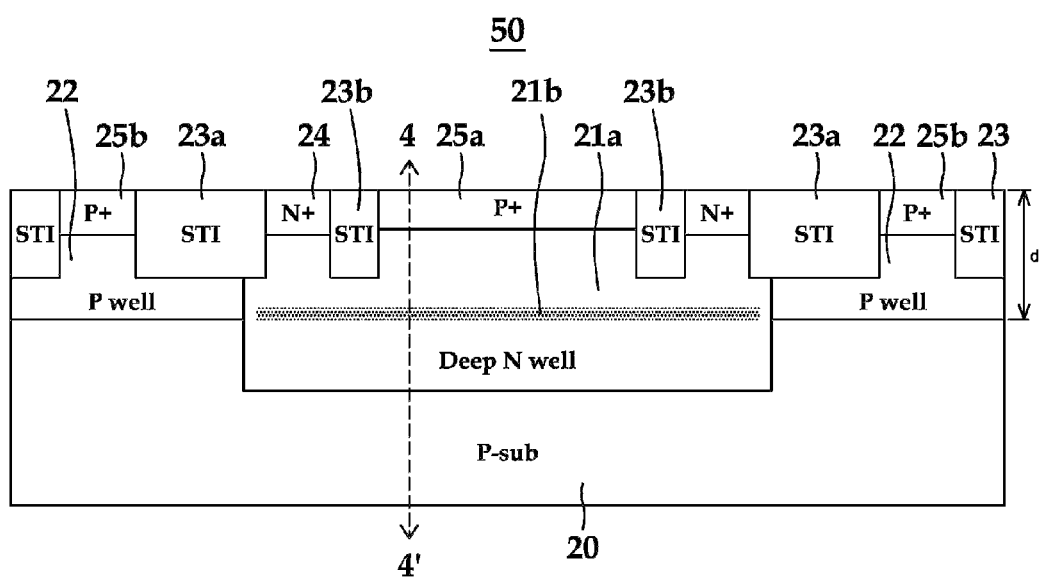
FIG. 3 is a diagram illustrating an example of a region of maximum doping concentration in a Hall sensor composition.

FIG. 3 is a diagram illustrating an example of maximum doping concentration location 21b in sensing region 21a.

Maximum doping concentration location 21b is placed lower than P-type high concentration doping region at a predetermined depth with respect to substrate surface. When maximum doping concentration region 21b is formed on sensing region 21a, which is placed under P-type high concentration doping region 25a, electric current flows certain distance away, avoiding defect of the semiconductor substrate surface. Electric current can flow fast enough and can reduce the occurrence of noise to improve Hall voltage sensitivity against noise.

Maximum doping concentration region 21b area is deeper than depth of trench isolation 23 so that the flow of electricity is not interfered by trench isolation 23. Since the depth of trench isolation 23 is approximately 0.3 μm, ion should be injected under condition of over 1000 KeV energy (high energy) to form ion injection Rp (projected ion range) at a deeper area.

Figure 4:
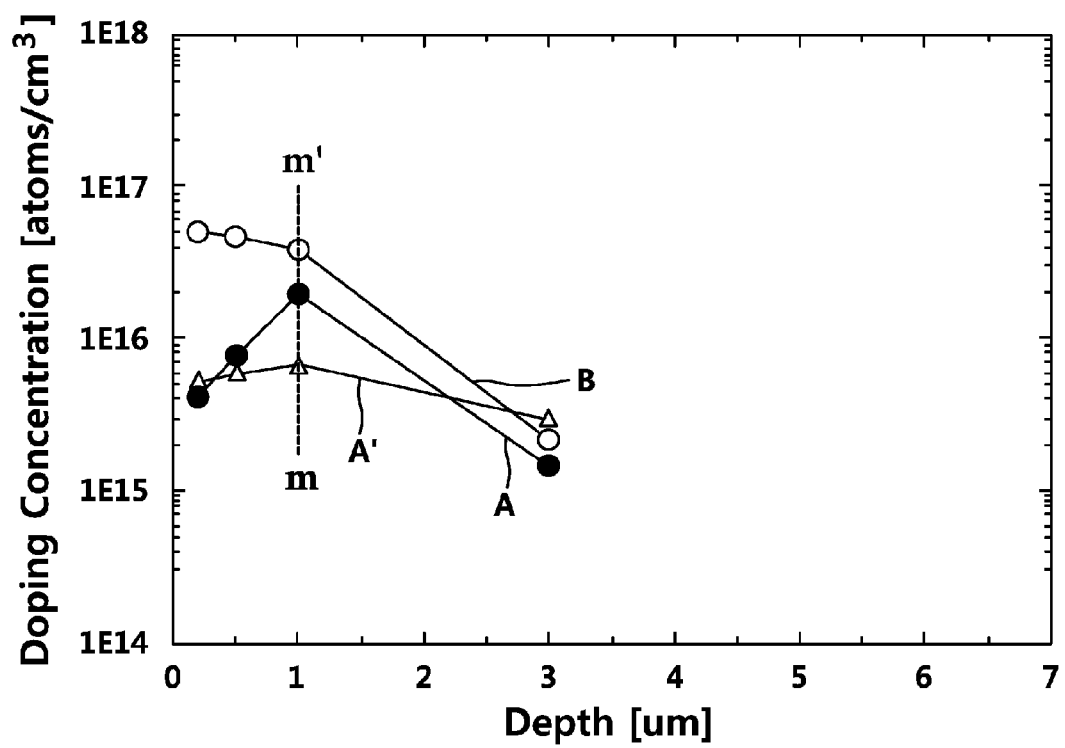
FIG. 4 is a diagram illustrating an example of a TOAD simulated doping profile of a Hall sensor.

FIG. 4 is a diagram illustrating an example of a TOAD (Technology Computer-Aided Design) simulated doping profile of dotted line 4-4' in the Hall sensor sensing region 21a of FIG. 3.

X-axis indicates depth from semiconductor surface 20 and Y-axis indicates doping concentration of sensing region 21a. A, A' and B shown in FIG. 4 indicate Hall sensor or Hall element and each graph shows a doping profile of sensing region 21a regarding A-type Hall sensor, A'-type Hall sensor, B-type Hall sensor. B-type Hall sensor is a Hall sensor which has a different doping profile wherein Hall resistance of B-type Hall sensor is smaller than the Hall resistance of either A-type Hall sensor or A'-type Hall sensor. Hall resistance is resistance of sensing region 21a and the Hall resistance value is inversely proportional to the doping concentration of sensing region 21a, i.e., an increase in the doping concentration of sensing region 21a decreases the Hall resistance value. Therefore, small resistance of B-type Hall sensor means doping concentration of sensing region 21a for the B-type Hall sensor is higher than the doping concentrations of sensing region 21a for either A-type or the A'-type Hall sensor.

Doping profile of A-type Hall sensor and A'-type Hall sensor is formed in an approximate parabolic shape, whereas B-type Hall sensor has highest concentration on semiconductor surface 20 and shows continuously decreasing doping profile. B-type Hall sensor is a sensor with a doping profile that consistently decreases linearly. Dotted line m-m' indicates maximum peak doping concentration of A-type Hall sensor and A'-type Hall sensor. The depth (d) of sensing region 21a is approximately 3 um from the semiconductor substrate surface. Depth of sensing region 21a differs according to doping concentration, ion injection energy, heat process temperature and time but in the present disclosure, depth of sensing region 21a is 3~4 um.

Doping profile on sensing region 21a of A-type Hall sensor or A'-type Hall sensor is a parabolic shape. N-type doping concentration is increasing to about approximately 1 μm (maximum peak point) from semiconductor substrate surface, i.e., top surface of P-type high concentration doping region 25a, and the doping concentration then decreases. Doping concentration is low on substrate 20 and doping concentration gradually increases as distance from the surface of the substrate 20 increases and forms maximum doping concentration at approximately 0.7~2 μm from the surface of the substrate 20. Herein, maximum doping concentration is formed at approximately 0.7~2 μm from surface of either P-type high concentration doping region 25a or substrate 20. For example, region with highest doping concentration value can be a boundary surface between sensing region 21a and P-type high concentration doping region 25a and can be formed at an approximate point of ⅓ from overall depth of sensing region 21a.

Moreover, maximum doping peak concentration of N-type sensing region 21a of A-type or A'-type Hall sensor has 1E15 to 1E17 atoms/cm$^3$. Maximum doping peak concentration of N-type sensing region 21a of A-type or A'-type Hall sensor has 3E15 to 4E16 atoms/cm$^3$. Surface concentration of sensing region 21a of Hall sensor is over 1E15 atom/cm$^3$ and under 1E17 atom/cm$^3$. Hall resistance decreases when doping concentration is higher than 1E17 atoms/cm$^3$, which is a detrimental since a decrease of Hall resistance relatively decreases the mobility of current carrier. Moreover, when doping concentration of sensing region becomes under 1E15 atoms/cm$^3$, Hall sensor resistance increases thereby increasing thermal noise, which is also a detrimental.

Furthermore, doping profile of sensing region 21a configured under reference plane m-m' is called a first doping profile and sensing region doping profile configured above-referenced plane m-m' is a second doping profile. A first doping gradient is opposite to a second doping gradient, which is steeper. Moreover, based on reference plane or reference line m-m', doping concentration of sensing region 21 above the reference plane is a first doping concentration section and that below the reference plane is a second doping concentration section. Sum of total doping concentration of a first doping concentration section is smaller than sum of total doping concentration of a second doping concentration, which induces a more active current flow to a maximum peak concentration from silicon substrate surface while having maximum peak concentration at a point apart of certain distance from silicon substrate surface. As overall doping concentration decreases carrier mobility increases. Moreover, a first doping concentration section distance is within 1 um and a second doping concentration section distance is approximately within 2 um. A second doping concentration section is longer than a first doping concentration section. Distance of sensing region 21a is approximately 3 um and distance of maximum peak doping concentration is approximately 1 um hereby shorter than 2 um of remainder section length.

Figure 5:
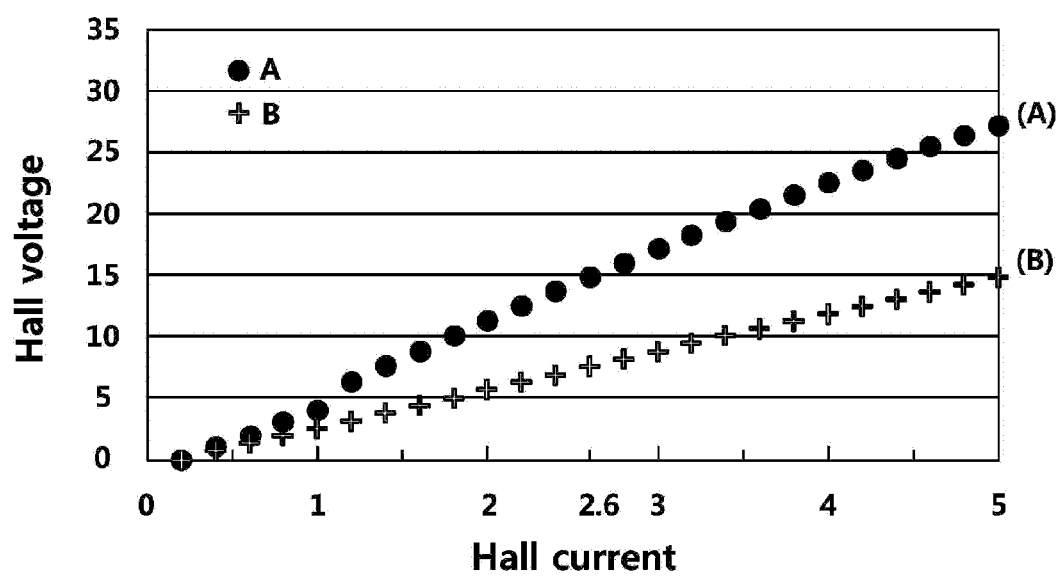
FIG. 5 is a diagram illustrating an example of a relationship between Hall current and Hall voltage in a Hall sensor.

FIG. 5 is a diagram illustrating an example of a relationship between Hall current and Hall voltage in a Hall sensor. In FIG. 5, A-type Hall sensor is a Hall sensor of the present disclosure and B-type Hall sensor is a Hall sensor with a lower Hall resistance than A-type Hall sensor. Moreover, A-type Hall sensor is a sensor with high concentration profile at point 0.7~2 μm as shown in FIG. 4. On the other hand, B-type Hall sensor has highest concentration on substrate surface and afterwards its concentration profile concentration decreases.

A-type Hall sensor generates higher Hall voltage than B-type Hall sensor at an identical Hall current. Moreover, Hall sensor still has a high value that can fully recognize Hall voltage output value despite 50% reduction in Hall current. Thus, despite reduction in conventional Hall sensor current consumption, Hall voltage can be fully detected. In other words, at same Hall current, a Hall sensor with maximum doping concentration placed at a certain distance apart from semiconductor substrate surface, generates higher Hall voltage than a Hall sensor with doping profile that consistently decreases linearly. Accordingly, the doping region of sensing region configured to sense electric field strength is formed in a parabolic shape and maximum peak doping concentration area is placed certain distance away from a semiconductor substrate surface.

Hall sensor shows different Hall voltage sensitivity in accordance to Hall resistance. In other words, when doping concentration of sensing region decreases or Hall resistance increases, current carrier mobility increases. This means improvement in Hall voltage sensitivity and has an effect of reducing Hall sensor's consumption current. Table 1 illustrates Hall voltage sensitivity of a Hall sensor with different value.

Table 1 shows relative Hall resistance value of a Hall sensor versus relative Hall voltage sensitivity and normalized based on B-type Hall sensor.

TABLE 1

| Item | B-type Hall sensor | A-type Hall sensor | A'-type Hall sensor |
| --- | --- | --- | --- |
| Relative Resistance of Hall element | 1 (Base) | 1.6 | 4 |
| Relative Hall voltage sensitivity | 1 (Base) | 1.06 | 1.16 |

According to Table 1, Hall voltage sensitivity increases as Hall resistance increases.

Moreover, when computing Hall voltage sensitivity of B-type Hall sensor as 1, relative Hall voltage sensitivity of A-type Hall sensor and A'-type Hall sensor are 1.06 and 1.16, respectively. Thereby, when Hall voltage sensitivity increases during Hall resistance increase, resistance of A-type Hall sensor increases approximately 1.6 times against B-type Hall sensor, it shows relative Hall voltage sensitivity of 1.06. However, when Hall resistance of A'-type Hall sensor increases approximately four times against B-type Hall sensor, it shows 1.16 relative Hall voltage sensitivity. Thus, Hall voltage sensitivity increases as Hall resistance increases, but Hall voltage sensitivity reaches saturation after some amount of increase.

When Hall resistance becomes too high, e-compass, which is vulnerable to noise may not be able to fully process its function because the possibility of the occurrence noise increases. For a Hall switch, which is insensitive of noise, Hall resistance can be raised.

The present disclosure provides a Hall sensor with doping concentration of maximum value at a predetermined depth from semiconductor substrate surface by ion injection and heating process. Thereby, it not only improves Hall voltage sensitivity with smaller amount of Hall current compared to conventional Hall sensor, but also decreases noise.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A Hall sensor comprising:
a semiconductor substrate;
a sensing region formed on the substrate;
an isolation region formed on the sensing region; and
a high concentration doping region formed on an upper portion of the sensing region,
wherein a maximum doping concentration region is formed at a predetermined depth with respect to the substrate surface and the maximum doping concentration region is under the high concentration doping region.

2. The Hall sensor of claim 1, wherein the predetermined depth is 0.7~2 μm from a surface of the substrate.

3. The Hall sensor of claim 1, wherein the maximum doping concentration region is under the isolation region.

4. The Hall sensor of claim 1, wherein the maximum doping concentration region is in the sensing region.

5. The Hall sensor of claim 1, wherein a doping profile of the sensing region is parabolic in shape.

6. The Hall sensor of claim 1, wherein a maximum doping concentration of the sensing region is from 1E15 atom/cm$^3$ to 1E17 atom/cm$^3$.

7. A Hall sensor comprising:
a semiconductor substrate;
a sensing region formed on the substrate;
an isolation region formed on the sensing region; and
a first high concentration doping region formed on a first portion of the sensing region; and,
a second high concentration doping region formed on a second portion of the sensing region.

8. The Hall sensor of claim 7, wherein:
a reference plane is located at a region of maximum doping concentration in the sensing region; and
a gradient of a first doping profile under the reference plane is steeper than a gradient of a second doping profile above the reference plane.

9. The Hall sensor of claim 7, further comprising:
a maximum doping concentration location in the sensing region as a reference plane,
a first doping concentration section with doping concentration of the sensing region under the reference plane; and
a second doping concentration section with doping concentration of the sensing region above the reference plane,
wherein the second doping concentration section is larger than the first doping concentration section.

10. The Hall sensor of claim 9, wherein a sum of doping concentration of the first doping concentration section and a sum of doping concentration of the second doping concentration section are different.

11. The Hall sensor of claim 7, wherein the first high concentration doping region has a different conductivity type from that of the second high concentration doping region.

12. A Hall sensor comprising:
a semiconductor substrate;
a sensing region formed on the substrate;
a first high concentration doping region formed on a portion of the sensing region;
a second high concentration doping region formed on an upper portion of the sensing region
an isolation region formed on the sensing region, the isolation region being in contact with the first high concentration doping region; and wherein a maximum doping concentration region is formed in the sensing region under the second high concentration doping region.

13. The Hall sensor of claim 12, wherein a depth of the sensing region is 3~4 μm.

14. The Hall sensor of claim 12, wherein the maximum doping concentration region is formed in the sensing region at a depth greater than a depth of the isolation region.

15. The Hall sensor of claim 12, wherein the sensing region has an opposite conductivity type to the semiconductor substrate.

* * * * *